(12) United States Patent
Woodford

(10) Patent No.: US 7,239,201 B2
(45) Date of Patent: Jul. 3, 2007

(54) APPARATUS FOR CONTROLLING MODULATION OF AN ALTERNATING WAVEFORM ON A DC VOLTAGE SIGNAL WITHIN A LOW-NOISE BLOCK CONTROLLER

(75) Inventor: Scott Allan Woodford, Austin, TX (US)

(73) Assignee: Silicon Laboratories, Austin, TX (US)

( * ) Notice: Subject to any disclaimer, the term of this patent is extended or adjusted under 35 U.S.C. 154(b) by 0 days.

(21) Appl. No.: 11/370,815

(22) Filed: Mar. 8, 2006

(65) Prior Publication Data

US 2006/0152278 A1 Jul. 13, 2006

Related U.S. Application Data

(62) Division of application No. 10/735,225, filed on Dec. 15, 2003, now Pat. No. 7,068,109.

(51) Int. Cl.
*H03F 3/38* (2006.01)

(52) U.S. Cl. .............................. 330/10; 330/51; 330/297

(58) Field of Classification Search ...................... None
See application file for complete search history.

(56) References Cited

U.S. PATENT DOCUMENTS 6,496,059 B1* 12/2002 Nguyen ........................ 330/10
6,734,724 B1* 5/2004 Schell et al. .................. 330/10

* cited by examiner

*Primary Examiner*—Khanh Van Nguyen
(74) *Attorney, Agent, or Firm*—Antony P. Ng; Dillon & Yudell LLP

(57) ABSTRACT

An apparatus for controlling modulation of an alternating waveform on a direct current (DC) voltage signal within a low-noise block (LNB) controller is disclosed. The apparatus includes a DC power supply and a mixing/switching circuit. The DC power supply provides a steady DC voltage to a load, such as an LNB amplifier. The mixing/switching circuit adds a modulating signal to the DC voltage and selectively allows the modulated DC voltage to the load. The mixing/switching circuit includes a common control signal input for managing both of the above-mentioned two functions.

9 Claims, 5 Drawing Sheets

APPARATUS FOR CONTROLLING MODULATION OF AN ALTERNATING WAVEFORM ON A DC VOLTAGE SIGNAL WITHIN A LOW-NOISE BLOCK CONTROLLER

CROSS-REFERENCE TO A RELATED APPLICATION

The present application is a divisional of U.S. patent application No. 10/735,225, filed on Dec. 15, 2003 now U.S. Pat. No. 7,068,109. Applicant claims benefit of priority under 35 U.S.C. § 120 to the above-mentioned patent application.

BACKGROUND OF THE INVENTION

1. Technical Field

The present invention relates to signal modulations in general, and in particular to an apparatus for controlling signal modulations. Still more particularly, the present invention relates to an apparatus for controlling modulation of an alternating waveform on a direct current voltage signal within a low-noise block controller.

2. Description of Related Art

A digital satellite communication system typically employs a ground-based transmitter that beams an uplink signal to a satellite positioned in a geosynchronous orbit. In turn, the satellite relays the signal back to various ground-based receivers. Such digital satellite communication system permits a household (or business) subscribing a satellite television service to receive audio and video signals directly from the satellite by means of a directional receiver antenna that is typically affixed to the roof or an external wall of the subscriber's residence.

A directional receiver antenna constructed to receive satellite signals typically includes a dish-shaped reflector that has a feed support arm protruding outward from the front surface of the reflector. The feed support arm supports an assembly in the form of a low-noise block (LNB) amplifier having an integrated LNB feed. The reflector collects and focuses satellite signals onto the LNB feed.

The satellite signals are commonly received at the Ku-band or C-band. The received satellite signals are first amplified and then downshifted to a predetermined frequency band, typically in the L-band. The satellite signals are then sent via a coaxial cable to a set-top box typically located adjacent to a subscriber's television.

The components within a set-top box can be divided into two major sections, namely, an LNB control section and a signal processing section. The signal processing section is beyond the scope of the present disclosure. The LNB control section controls the functionality of an LNB amplifier located on the feed support arm of a directional receiver antenna.

Generally speaking, the LNB control section includes, inter alia, a direct current (DC) power supply, a summing circuit, a switch and an LNB control device. The DC power supply, the summing circuit and the switch are discrete components external to the LNB control device. The LNB control device typically generates various control signals for controlling the DC power supply, the summing circuit, and the switch. For example, the LNB control device provides an alternating waveform to be added to a DC voltage signal originated from the DC power supply, and the waveform modulation is performed within the summing circuit. In addition, the LNB control device provides a switch control signal to control the switch that allows the modulated DC voltage signal to pass to an LNB amplifier.

The present disclosure provides an improved apparatus for controlling the modulation of an alternating waveform on a DC voltage signal within a LNB controller.

SUMMARY OF THE INVENTION

In accordance with a preferred embodiment of the present invention, an apparatus for controlling modulation of an alternating waveform on a direct current (DC) signal within a low-noise block (LNB) controller includes a DC power supply and a mixing/switching circuit. The DC power supply provides a steady DC voltage to a load, such as an LNB amplifier. The mixing/switching circuit adds a modulating signal to the DC voltage and selectively allows the modulated DC voltage to the load. The mixing/switching circuit includes a common control signal input for managing both of the above-mentioned two functions.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
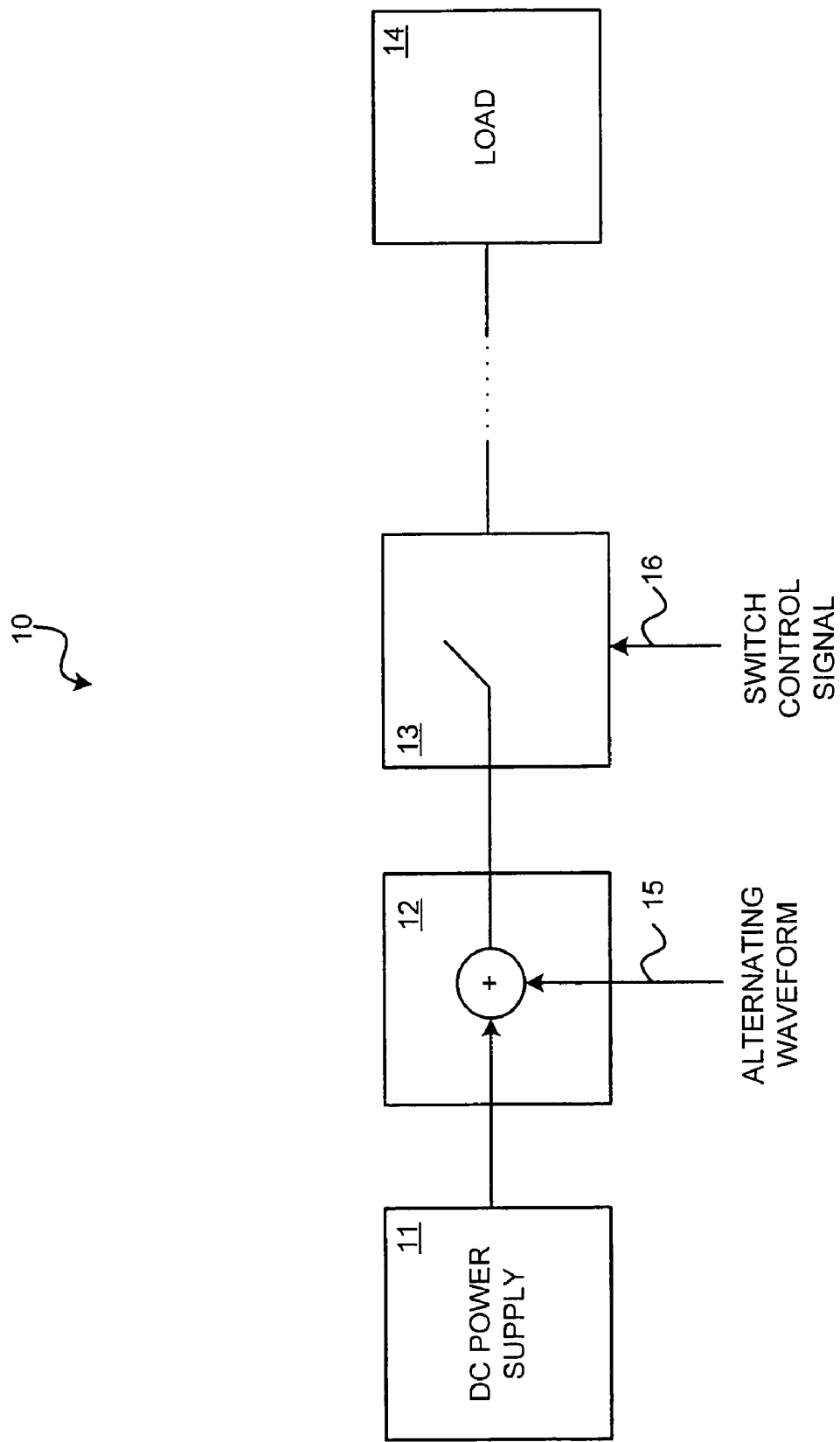
FIG. 1 is a conceptual block diagram of an apparatus for controlling modulation of an alternating waveform on a direct current (DC) voltage signal within a low-noise block (LNB) controller.

With reference now to the drawings and in particular to FIG. 1, there is illustrated a conceptual block diagram of an apparatus for controlling modulation of an alternating waveform on a direct current (DC) voltage signal within a low-noise block (LNB) controller, in accordance with a preferred embodiment of the present invention. As shown, an apparatus 10 includes a DC power supply 11, a summing circuit 12 and a switch 13. An alternating waveform is added to a DC voltage originated from DC power supply 11 via an input 15 within summing circuit 12 to produce a modulated DC voltage. The modulated DC voltage is intended for a load 14 such as an LNB amplifier. The modulated 11 DC voltage can be disconnected from load 14 via a switch control signal at an input 16 within switch 13. The alternating waveform to input 15 and the switch control signal to input 16 are preferably provided by an LNB control device (not shown).

It is clear that an implementation of the conceptual block diagram as shown in FIG. 1 requires two signal inputs, i.e., inputs 15 and 16. Accordingly, two signal input pins are required for the LNB control device in order to provide the required signal controls as shown in FIG. 1. As packages for integrated circuits become increasingly smaller, it is important to reduce the number of pins on an integrated circuit device, such the LNB control device, if it is at all possible.

Figure 2:
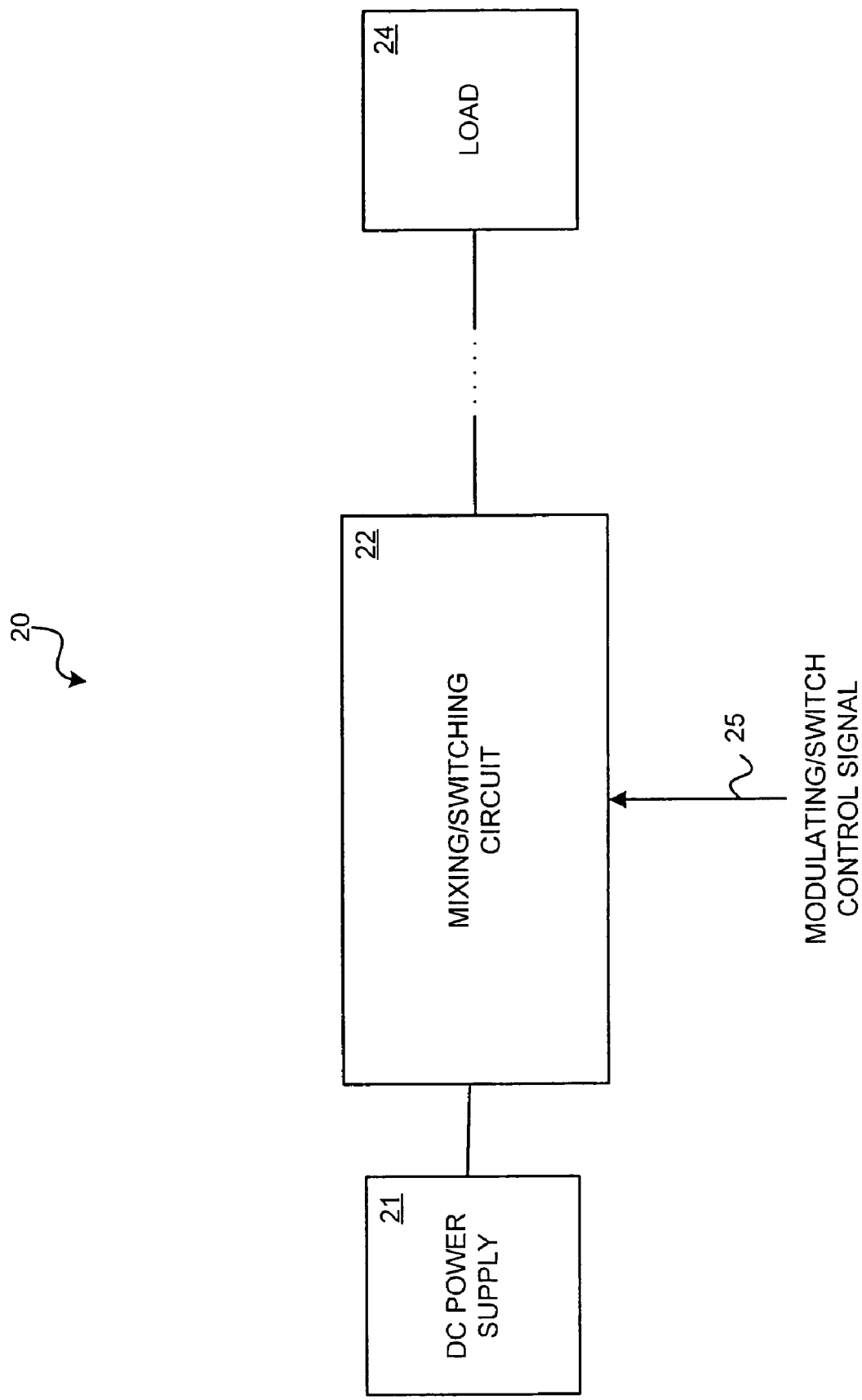
FIG. 2 is a functional block diagram of an apparatus for controlling modulation of an alternating waveform on a DC voltage signal within an LNB controller, in accordance with a preferred embodiment of the present invention.

With reference now to FIG. 2, there is depicted a functional block diagram of an apparatus for controlling modulation of an alternating waveform on a DC voltage signal within an LNB controller, in accordance with a preferred embodiment of the present invention. As shown, an apparatus 20 includes a DC power supply 21 and a mixing/switching circuit 22. DC power supply 21 outputs a steady DC voltage. Mixing/switching circuit 22 is configured to add a modulating signal to the DC voltage from DC power supply 21. In addition, mixing/switching circuit 22 can selectively allow the modulated DC voltage to reach a load 24 such as an LNB amplifier. Instead of having two separate control signal inputs (as shown in FIG. 1), a single signal input 25 is utilized to supply a modulating/switch signal for the control of the above-mentioned two functions of mixing/switching circuit 22. The modulating/switch signal is preferably provided by an LNB control device (not shown) located apart from apparatus 20.

Figure 3:
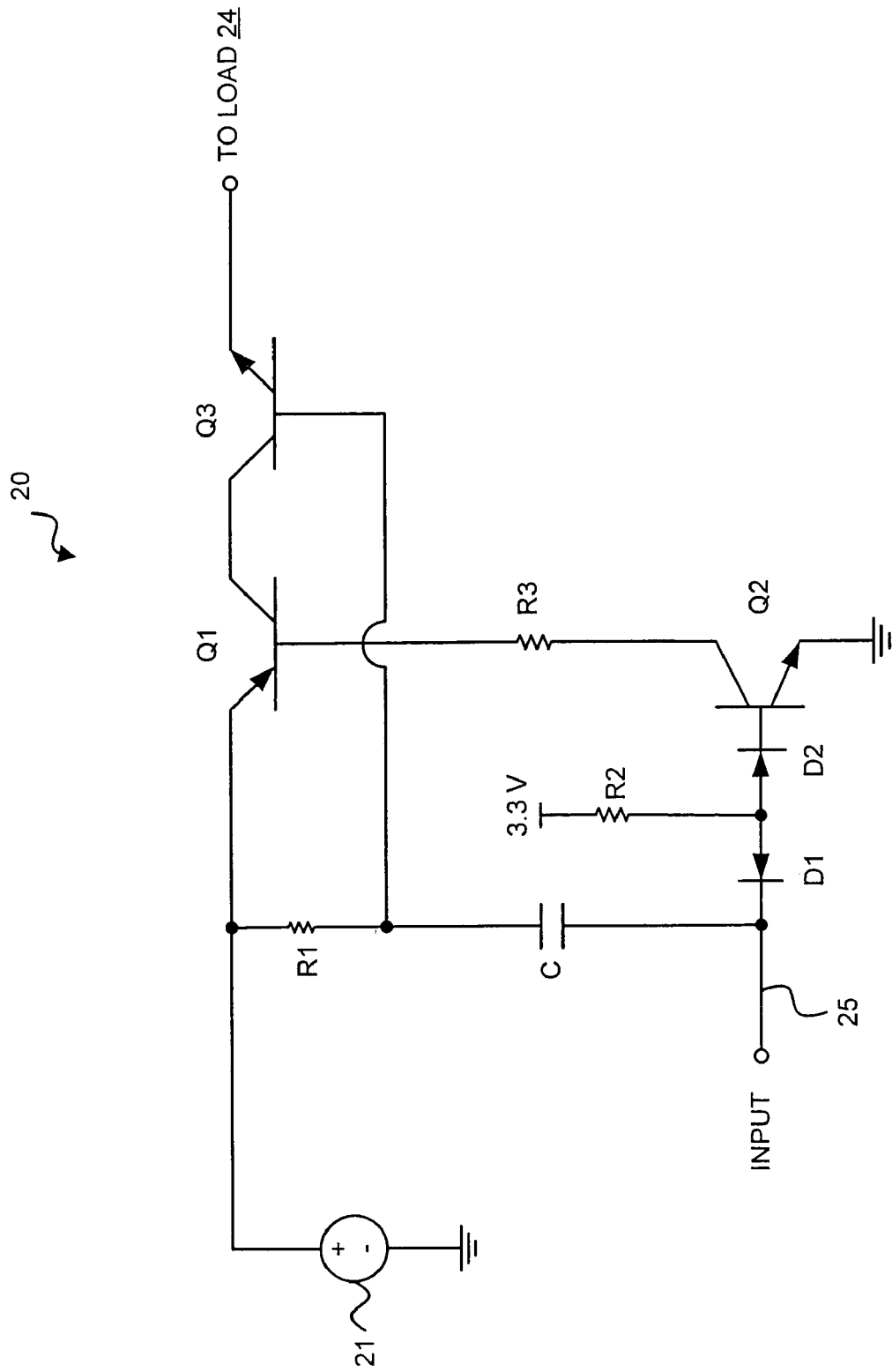
FIG. 3 is a circuit diagram of the apparatus from FIG. 2, in accordance with a preferred embodiment of the present invention.

Referring now to FIG. 3, there is illustrated a circuit diagram of apparatus 20 from FIG. 2, in accordance with a preferred embodiment of the present invention. As shown, apparatus 20 includes a capacitor C, two diodes D1-D2, three resistors R1-R3 and three transistors Q1-Q3. The emitter of transistor Q1 is connected to the positive terminal of power supply 21. The emitter of transistor Q1 is also connected to the base of transistor Q3 via resistor R1. The base of transistor Q1 is connected to the collector of transistor Q2 via resistor R3. The collector of transistor Q1 is connected to the collector of transistor Q3. The base of transistor Q2 is connected to signal input 25 via diodes D1-D2 connected in series. Specifically, the anode of diode D1 is connected to the anode of diode D2, and a 3.3 V power supply is connected to the anodes of diodes D1-D2 via resistor R2. The emitter of transistor Q2 is connected to ground. The base of transistor Q3 is also connected to signal input 25 via capacitor C. The emitter of transistor Q3 provides a modulated DC voltage to a load, such as load 24.

Transistor Q3, resistor R1 and capacitor C together provide the modulation of an alternating waveform from signal input 25 to a DC voltage from DC supply 21. Also, transistors Q1-Q2, resistors R2-R3 and diodes D1-D2 perform the switching function.

Preferably, transistor Q1 is a PNP transistor, transistor Q2 is an NPN transistor and transistor Q3 is an NPN Darlington transistor. Also, the resistances of resistor R1, resistor R2 and resistor R3 are 2.2 kΩ, 33 kΩ and 2.2 kΩ, respectively. The capacitance of capacitor C is 100 nF.

As mentioned above, signal input 25 adds an alternating waveform to a DC voltage and selectively allows the modulated DC voltage to reach load 24. This is accomplished by dividing the total voltage operating range of apparatus 20 into two modes, namely, a modulation mode and a disconnect mode. During the modulation mode, an alternating waveform is added to the DC voltage from DC power supply 21 and the modulated DC voltage is allowed to reach load 24. During the disconnect mode, the DC voltage is not modulated and is prevented from reaching load 24.

I. Modulation Mode

Apparatus 20 can be maintained in the modulation mode by keeping signal input 25 above 0.9 V to keep diode D1 off. As such, current is permitted to be supplied through resistor R2 and diode D2 to the base of transistor Q2, allowing transistor Q2 to carry enough collector current to maintain transistor Q1 in, or close to, saturation. Such is necessary to provide enough current to the load to maintain the desired load voltage.

Resistor $R1 \gg 1/(2\pi fC) = Xc$, where f is the frequency of an alternating waveform, and Xc is the capacitive reactance of capacitor C at frequency f. This decouples the base of transistor Q3 from the collector of transistor Q3 at frequency f of the alternating waveform, allowing the alternating waveform at signal input 25 to couple across capacitor C to the base of transistor Q3. Transistor Q3 then modulates the alternating waveform at the base of transistor Q3 onto the DC voltage from DC power supply 21 in an emitter-follower manner. The frequency f of the alternating waveform is preferably 22 kHz.

II. Disconnect Mode

The disconnect mode occurs when signal input 25 is pulled low (i.e., less than 0.6 V but preferably 0 V). This causes diode D1 to turn on, diverting the current supplied through resistor R2 to signal input 25. Since this current is no longer supplied to the base of transistor Q2, transistor Q2 is turned off, stopping the collector of transistor Q2 from sinking current from the base of transistor Q1. In turn, transistor Q1 is stopped from supplying current through its collector to load 24, disconnecting the DC power supply 21 from load 24.

Figure 4:
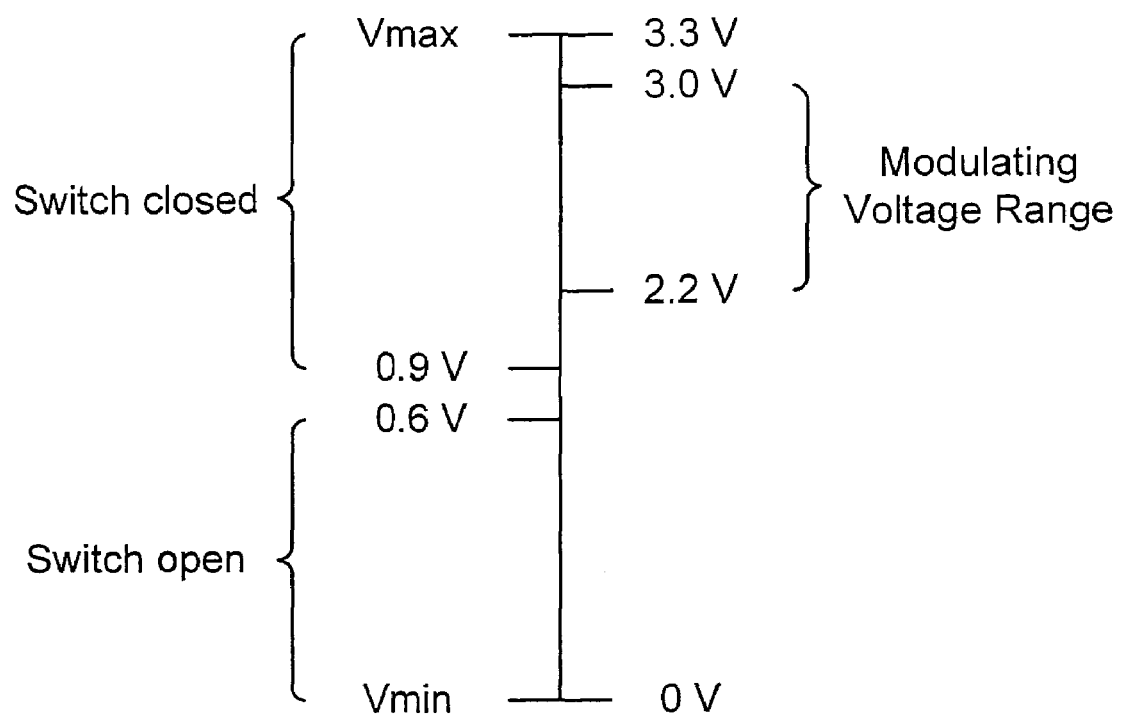
FIG. 4 is a graphical illustration of the range for a control signal for the apparatus from FIG. 2, in accordance with a preferred embodiment of the present invention.

With reference now to FIG. 4, there is depicted a graphical illustration of the entire voltage operating range for a modulating/switch control signal at signal input 25, in accordance with a preferred embodiment of the present invention. As shown, $V_{min}$ is preferably 0 V, and $V_{max}$ is preferably 3.3 V. DC power supply 21 is disconnected from load 24 when signal input 25 is below approximately 0.6 V. DC power supply 21 is connected to load 24 when signal input 25 is above approximately 0.9 V. Modulation occurs when signal input 25 is approximately between 0.9 V and 3.3 V. The voltage range of the alternating waveform on the DC voltage is preferably between 2.2 V and 3.0 V.

As an example, if the range of the voltage to signal input 25 ($V_p$) is between 0 V and 3.3 V, and it is desirable to modulate a ±0.4 V signal onto the DC voltage from DC power supply 21, apparatus 20 can be operated under the modulation mode with $V_p=2.6$ V±0.4 V, and under the disconnect mode with $V_p=0$ V.

Figure 5:
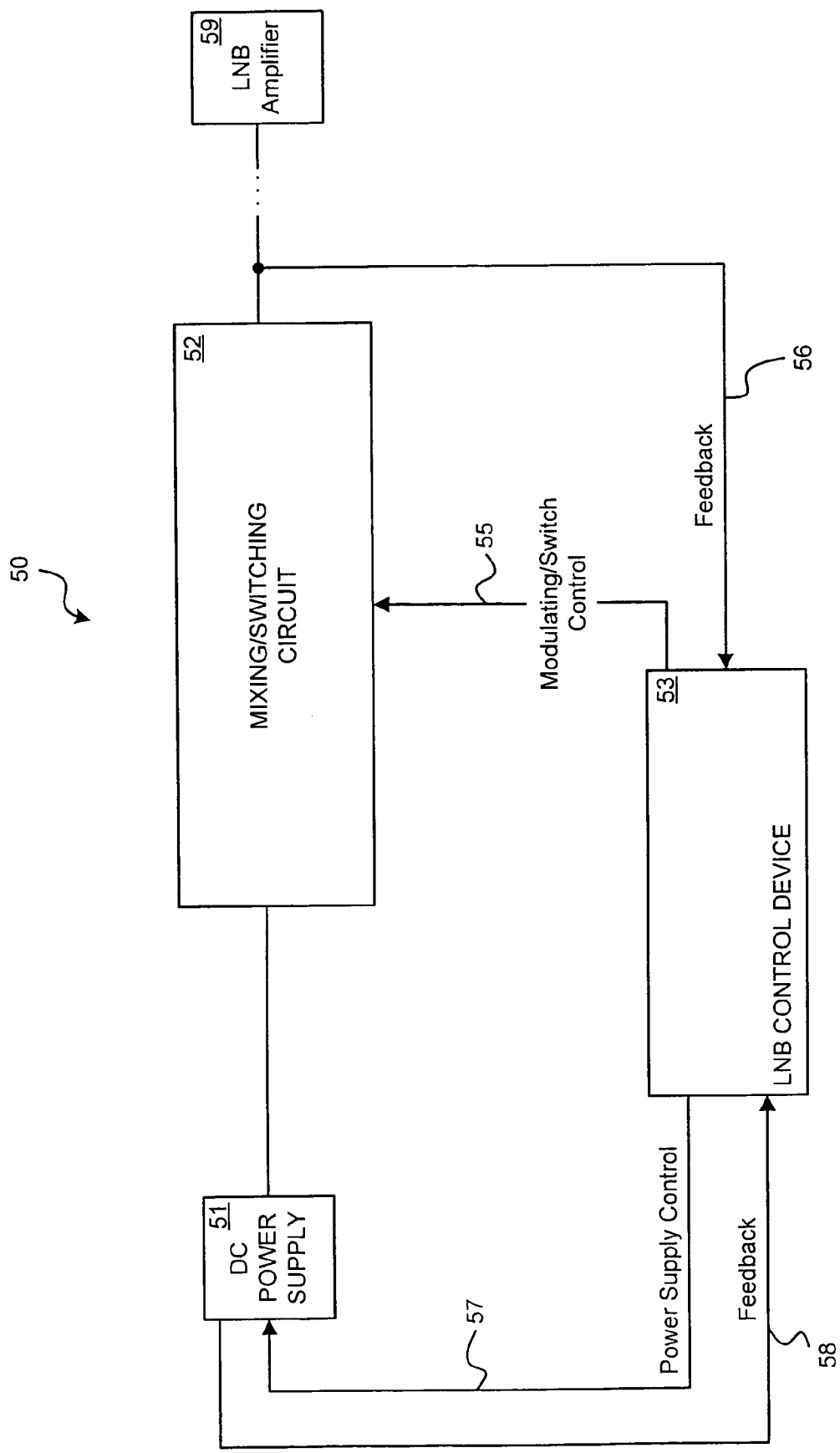
FIG. 5 is a simplified block diagram of an LNB controller within a satellite video receiver for controlling an LNB amplifier on a satellite dish, in which a preferred embodiment of the present invention is incorporated.

Referring now to FIG. 5, there is depicted a simplified block diagram of an LNB controller within a satellite video receiver for controlling an LNB amplifier on a satellite dish, in which a preferred embodiment of the present invention is incorporated. As shown, an LNB controller 50 includes a DC power supply 51, a mixing/switching circuit 52 and an LNB control device 53. DC power supply 51 outputs a DC voltage signal to mixing/switching circuit 52. An alternating waveform is then added to the DC voltage signal via a signal input 58 from LNB control device 53. LNB control device 53 controls DC power supply 51 via a power supply control line 57. In turn, DC power supply 51 provides a feedback to LNB control device 53 via a feedback line 58. In addition, LNB control device 53 receives a feedback from LNB amplifier 56 via a feedback line 56.

As has been described, the present invention provides an improved apparatus for controlling the modulation of an alternating waveform on a DC signal within an LNB controller.

While the invention has been particularly shown and described with reference to a preferred embodiment, it will be understood by those skilled in the art that various changes in form and detail may be made therein without departing from the spirit and scope of the invention.

What is claimed is:

1. An apparatus for controlling modulation of an alternating waveform on a direct current (DC) signal intended for a load, said apparatus comprising:
    a DC power supply for providing a DC voltage signal; and
    a mixing/switching circuit, which includes a first transistor and a capacitor, for adding a modulating signal to said DC voltage signal and for selectively allowing or disallowing said modulated DC voltage signal to supply said load, wherein said mixing/switching circuit includes a common control signal input for controlling said adding function and said selectively allowing function.

2. The apparatus of claim 1, wherein said first transistor is an NPN Darlington transistor.

3. The apparatus of claim 1, wherein said mixing/switching circuit further includes a second and third transistors, two resistors and two diodes for selectively allowing said modulated DC voltage signal to supply said load.

4. The apparatus of claim 3, wherein said second transistor is a PNP transistor and said third transistor is an NPN transistor.

5. The apparatus of claim 1, wherein said apparatus operates either in a modulation mode or in a disconnect mode.

6. A method for controlling modulation of an alternating waveform on a direct current (DC) signal intended for a load, said method comprising:
    providing a DC voltage signal;
    adding a modulating signal to said DC voltage signal via a first transistor and a capacitor;
    selectively allowing said modulated DC voltage signal to supply said load.

7. The method of claim 6, wherein said first transistor is an NPN Darlington transistor.

8. The method of claim 6, wherein said selectively allowing is performed via a second and third transistors, two resistors and two diodes.

9. The method of claim 8, wherein said second transistor is a PNP transistor and said third transistor is an NPN transistor.

* * * * *